(12) United States Patent
Ng et al.

(10) Patent No.: US 9,302,296 B2
(45) Date of Patent: Apr. 5, 2016

(54) ASSEMBLY FOR SORTING OPTOELECTRONIC DEVICES

(75) Inventors: Aylwin Ng, Penang (MY); Bernard Raj Thomas, Penang (MY)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 14/360,601

(22) PCT Filed: Nov. 29, 2011

(86) PCT No.: PCT/EP2011/071295
§ 371 (c)(1),
(2), (4) Date: Nov. 17, 2014

(87) PCT Pub. No.: WO2013/079096
PCT Pub. Date: Jun. 6, 2013

(65) Prior Publication Data
US 2015/0060233 A1    Mar. 5, 2015

(51) Int. Cl.
| B65G 47/24 | (2006.01) |
| B07C 5/36 | (2006.01) |
| H01L 21/67 | (2006.01) |
| B65G 29/00 | (2006.01) |
| H01L 21/677 | (2006.01) |

(52) U.S. Cl.
CPC . B07C 5/36 (2013.01); B65G 29/00 (2013.01); H01L 21/677 (2013.01); H01L 21/67271 (2013.01)

(58) Field of Classification Search
CPC ........... B65G 47/1457; B65G 47/1407; B65G 47/1428; B65G 47/02; B65G 47/04
USPC ........... 198/392, 396, 397.01, 397.04, 397.05
See application file for complete search history.

(56) References Cited

U.S. PATENT DOCUMENTS

| 3,254,753 | A | * | 6/1966 | Aidlin | 198/397.02 |
| 3,980,553 | A | | 9/1976 | Quinn | |
| 4,938,082 | A | * | 7/1990 | Buckley et al. | 198/392 |
| 4,979,607 | A | * | 12/1990 | Fogg | 198/392 |
| 5,954,185 | A | * | 9/1999 | Eshelman et al. | 198/396 |
| 5,984,079 | A | * | 11/1999 | Garcia | 198/397.02 |
| 6,204,464 | B1 | * | 3/2001 | Garcia et al. | 209/643 |
| 2004/0155626 | A1 | | 8/2004 | Hedegor et al. | |

FOREIGN PATENT DOCUMENTS

| EP | 0427611 A1 | 5/1991 |
| JP | H03185366 A | 8/1991 |

(Continued)

*Primary Examiner* — James R Bidwell
(74) *Attorney, Agent, or Firm* — McDermott Will & Emery LLP

(57) ABSTRACT

An assembly for sorting optoelectronic devices (14) is specified, said assembly comprising: a plurality of inner bins (1) arranged alongside a inner circle having a first diameter, —a plurality of outer bins (2) arranged alongside an outer circle having a second diameter greater than the first diameter, —a conveyor (3), wherein —the conveyor (3) is configured to transport a plurality of optoelectronic devices (14), —the inner circle, the outer circle and the conveyor (3) are arranged concentric with respect to each other and share a common axis (4), —the conveyor (3) is arranged between the inner circle and the outer circle, —the conveyor (3) is pivot-mounted with respect to the axis (4), —and the conveyor (3) is rotatable with respect to the inner bins (1) and the outer bins (2).

12 Claims, 2 Drawing Sheets

(56) References Cited

FOREIGN PATENT DOCUMENTS

| | | |
|---|---|---|
| JP | H05164818 A | 6/1993 |
| JP | H07260880 A | 10/1995 |
| JP | 2002029627 A | 1/2002 |
| JP | 2003177150 A | 6/2003 |
| JP | 2007045597 A | 2/2007 |
| WO | WO-2011048627 A1 | 4/2011 |

* cited by examiner

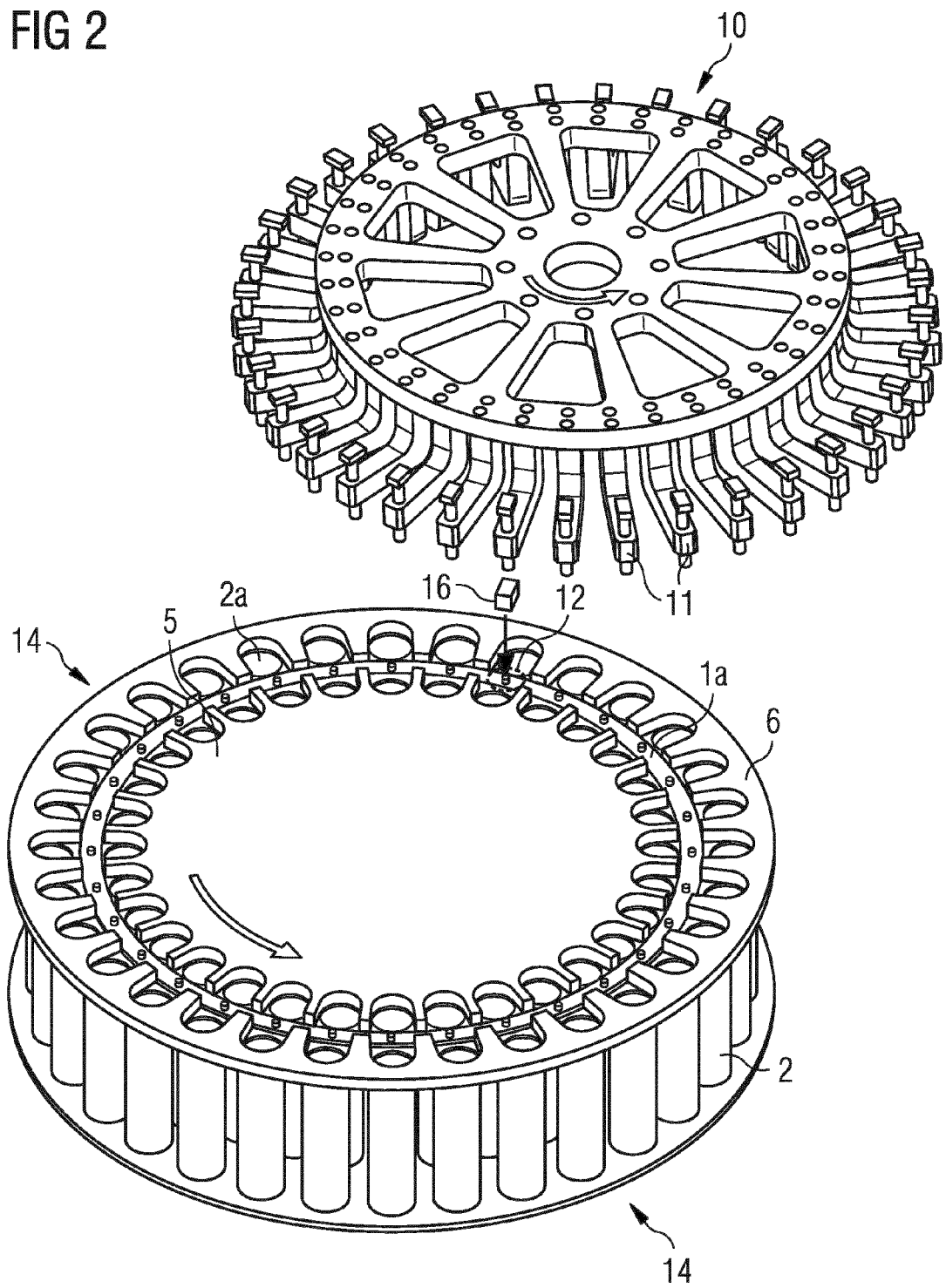

ASSEMBLY FOR SORTING OPTOELECTRONIC DEVICES

SUMMARY

An assembly for sorting optoelectronic devices is specified.

It is one object to specify an assembly for sorting optoelectronic devices by means of which a sorting, for example, binning of optoelectronic devices, can be performed in a particularly short time.

According to one aspect of the assembly for sorting optoelectronic devices, the assembly is suited for the sorting and handling of optoelectronic devices. In particular, the assembly is configured for the sorting of radiation-emitting optoelectronic devices like light-emitting diodes or semiconductor lasers. For example the optoelectronic device comprises at least one semiconductor chip for the emission of electromagnetic radiation and a housing which surrounds said at least one chip in places.

For example the optoelectronic devices are sorted with respect to at least one characteristic of the radiation emitted by the devices during operation of the devices. For example, the optoelectronic devices are sorted with respect to the chromaticity coordinates of the emitted radiation, the intensity of the emitted radiation and/or the brightness of the emitted radiation. Thus the assembly is configured for the so-called binning of optoelectronic devices.

According to one aspect of the assembly the assembly comprises a plurality of inner bins which are arranged alongside an inner circle which has a first diameter. For example, the assembly comprises 16 or 32 inner bins. The inner bins can be of similar type. For example all inner bins have the same size and shape.

Here and in the following a bin is understood to be a container which is configured for the collection of at least one optoelectronic device. In particular the container is configured to collect and hold a plurality of optoelectronic devices.

The inner bins are arranged alongside an inner circle which has a first diameter. That means that the assembly comprises a plurality of containers which are arranged in a circle. For example the inner bins are arranged at equal distances to each other along the inner circle. Thereby the inner bins of the assembly are arranged in a circle within the fabrication tolerance of the assembly. That means the inner bins do not have to be arranged in a circle in terms of the mathematical meaning of the term "circle".

According to one aspect of the assembly the assembly comprises a plurality of outer bins which are arranged alongside an outer circle having a second diameter, the second diameter being greater than the first diameter. Thereby the outer bins of the assembly are arranged in a circle within the fabrication tolerance of the assembly. That means the outer bins do not have to be arranged in a circle in terms of the mathematical meaning of the term "circle".

In particular the outer bins are similar to the inner bins. For example, the outer bins have the same size and shape as the inner bins. Like the inner bins, the outer bins are arranged in a second, outer circle which has a second diameter which is greater than the first diameter.

According to one aspect of the assembly the assembly comprises a conveyor. The conveyor is configured to transport a plurality of optoelectronic devices. For example, the number of optoelectronic devices which can be transported by the conveyor at the same time is at least the number of inner bins or the number of outer bins. The conveyor has a size and a shape which enables it to carry the optoelectronic devices which are sorted by means of the assembly. Thereby the optoelectronic devices can be simply placed onto the conveyor. In this case the optoelectronic devices are held on the conveyor by means of gravity and friction. However, it is also possible that the conveyor comprises means for holding optoelectronic devices. For example, such means can be in the form of clamps or fasteners.

According to one aspect of the assembly the inner circle, the outer circle and the conveyor are arranged concentrically with respect to each other. In other words, the inner circle, the outer circle and the conveyor are arranged coaxially with respect to a common axis. For example, the inner circle is surrounded by the conveyor and the conveyor is surrounded by the outer circle. All three components of the assembly, the inner circle, the outer circle and the conveyor are then arranged concentrically with respect to other and share the common axis. Thereby the components of the assembly are arranged concentrically with respect to each other within the fabrication tolerance of the assembly. That means the components of the assembly do not have to be arranged concentrically in terms of the mathematical meaning of the term "concentric".

According to one aspect of the assembly the conveyor is arranged between the inner circle and the outer circle. In other words, the conveyor is surrounded by the outer circle and the outer circle surrounds the conveyor and the inner circle. Furthermore, the outer bins, which are arranged alongside the outer circle, surround the conveyor and the inner bins, which are arranged alongside the inner circle.

According to one aspect of the assembly the conveyor is pivot-mounted with respect to the axis. That means that the conveyor can spin around the axis with respect to which the inner circle, the outer circle and the conveyor are arranged coaxial to each other.

According to one aspect of the assembly the conveyor is rotatable with respect to the inner bins and the outer bins. For example, the conveyor is rotatable with respect to the inner bins and the outer bins while the inner bins and the outer bins are arranged stationary with respect to each other. Due to this configuration of the conveyor and the bins, optoelectronic devices transported by the conveyor can be moved between the inner bins and the outer bins.

For instance, the assembly comprises a plurality of sorting regions, wherein each sorting region is arranged between an inner bin and an outer bin. For example, each sorting region is assigned bijectively to one inner bin and one outer bin. By rotation of the conveyor an optoelectronic device placed on the conveyor can be moved from one sorting region to an adjacent sorting region. At each sorting region a decision is made into which bin the optoelectronic device is placed—the inner bin or the outer bin—assigned to the sorting region.

According to one aspect of the assembly the assembly is configured for the sorting of electronic devices. The assembly comprises a plurality of inner bins arranged alongside the inner circle having a first diameter, the assembly further comprises a plurality of outer bins arranged alongside an outer circle having a second diameter greater than the first diameter and the assembly comprises a conveyor. The conveyor is configured to transport a plurality of optoelectronic devices, the inner circle, the outer circle and the conveyor are arranged concentrically with respect to each other and share a common axis, the conveyor is arranged between the inner circle and the outer circle, the conveyor is pivot-mounted with respect to the axis and the conveyor is rotatable with respect to the inner bins and the outer bins.

According to the assembly the conveyor is rotating with respect to all bins. That means that the units sorted with the assembly, for example the optoelectronic devices, are transported by the conveyor instead of directly dropping the units into the bins. For example, when there is power failure or a vacuum failure at a pickup head which holds the units, the units will remain on the conveyor instead entering a, e.g. wrong, bin directly.

Further, by rotating the conveyor, the power consumption is lower than in the case of rotating the bins. Due to this, a smaller sized servomotor can be used.

Furthermore, as inner and outer bins are arranged around the conveyor, a great number of bins can be arranged on a rather small space. Consequently, the assembly where the inner bins and the outer bins are arranged alongside circles is less space-consuming as, for example, linear sorting assemblies where the bins are arranged alongside a line.

According to one aspect of the assembly the conveyor is in the shape of a ring. For example, the conveyor consists of or comprises a ring-shaped buffer plate, wherein the optoelectronic devices can be, for example, placed on an end face of the ring. The end face of the ring acts as a transport surface conveyor. In this case the conveyor is a single-pieced component.

According to one aspect of the assembly the inner bins and the outer bins are arranged to be stationary. Accordingly, the conveyor rotates with respect to the inner bins and the outer bins, while the inner bins and the outer bins are not moved during operation of the assembly.

According to one aspect of the assembly each bin, that means each inner bin and each outer bin, has an opening which is configured for receiving an optoelectronic device. The shape and size of the opening are chosen in such a way that an optoelectronic device can be dropped without getting stuck at the opening of the bin. Further, each opening is arranged at the same height as the transport surface or below the transport surface of the conveyor. The transport surface of the conveyor is the surface of the conveyor on which optoelectronic devices are placed, e.g. the end face of the ring-shaped buffer plate.

The optoelectronic devices rotate due to the rotation of the conveyor while they stick on the transport surface. When an optoelectronic device located on the transport surface reaches the right sorting region it can be, for example, blown by a blower into the right inner or outer bin assigned to the sorting region. Due to the fact that the opening of the bin is arranged at the same height as, or below, the transport surface, the optoelectronic devices can be blown into the bin without getting stuck at the opening of the bin.

According to one aspect of the assembly the assembly comprises means at each bin which are configured for guiding an optoelectronic device from the transport surface of the conveyor to the opening of the bin. Such means can be, for example, given by rims or fingers which are arranged in the region of the openings of the bins and, for example, surround these openings, at least in some places. By means of the means an optoelectronic device is guided to and into the opening of a bin, in particular the optoelectronic device cannot be blown over the opening, but the means provide a barrier which prevents the loss of optoelectronic devices.

According to one aspect of the assembly the assembly comprises an inner guide plate having a plurality of recesses, wherein the inner guide plate projects above the openings of the inner bins, and in the region of each recess the inner guide plate partially surrounds the opening of an inner bin assigned to the recess. For example, the region of the opening facing the conveyor is free of the guide plate in such a way that the optoelectronic device can reach the opening without being constrained or obstructed by the guide plate. The guide plate prevents optoelectronic devices from being blown or pushed beyond the opening. Accordingly, the inner guide plate forms means which are configured for guiding an optoelectronic device from the transport surface of the conveyor to the opening.

According to one aspect of the assembly the assembly comprises an outer guide plate having a plurality of recesses, wherein the outer guide plate projects above the openings of the outer bins and, in the region of each recess, the outer guide partially surrounds the openings of an outer bin assigned to the recess. Thereby, the outer guide plate also works as means configured for guiding an optoelectronic device from the transport surface of the conveyor to the opening of the bin. In particular the region of the opening facing the conveyor is free of the outer guide plate such that an optoelectronic device can reach the opening. The outer guide plate prevents optoelectronic devices from being moved beyond the opening.

According to one aspect of the assembly at least one of the outer bins and/or at least one of the inner bins has a cylindrical shape. In this case, for example, each bin of the assembly is a metallic or plastic cylinder or barrel which has a round opening through which optoelectronic devices can access the bin.

According to one aspect of the assembly the assembly comprises an equal number of outer bins and inner bins. For example the assembly comprises 16 or 32 inner bins and 16 or 32 outer bins.

According to one aspect of the assembly the assembly comprises a turret with a plurality of holders; each holder is configured to carry one optoelectronic device. For example the turret is in the form of a ring-shaped plate. The turret functions as a conveyor which can take a plurality of indexed positions. Several regularly spaced holders are fixed to the turret or formed in one piece with the turret. Each holder, for example, comprises a pickup head which is configured to carry at least one, or exactly one, optoelectronic device. Several regularly spaced regions of processing stations can be defined around the turret, each of which is generally occupied by a processing station for processing the optoelectronic device. Processing operations performed by these stations may include handling, electric testing, optical testing, sorting, binning of the optoelectronic devices. One of the stations for processing is the dropping of the optoelectronic device onto the conveyor of the assembly. The processing stations placed around the turret can form a cycle of successive operations performed by the conveyed optoelectronic devices, wherein the dropping of the device onto the assembly is the last processing step performed by means of the turret.

Further, a method for sorting a plurality of optoelectronic devices is specified. For the method an assembly as described here is used. That means all features described for the assembly are also described for the method for sorting a plurality of optoelectronic devices and vice versa. According to the method a holder of the turret is placed above the dropping region of the transport surface. The dropping region is the region of the transport surface of the conveyor, where exactly one optoelectronic device is dropped from a holder of the turret to the conveyor. From the dropping region, the optoelectronic device can be transported by the conveyor to a sorting region, where the optoelectronic device is placed into the right bin for the optoelectronic device.

After the holder of the turret is placed above a dropping region of the transport surface, the optoelectronic device is dropped from the holder onto the dropping region. In a next method step the conveyor is rotated with respect to the inner bins and the outer bins, transporting the optoelectronic device from the dropping region to a sorting region. The sorting region is a region of the transport surface of the conveyor from which the sorting of the device into a bin can be done. The sorting region is placed between an outer bin and an inner bin, both adjacent to the sorting region. Each sorting region is bijectively assigned to exactly one outer bin and exactly one inner bin.

In a next method step which can be performed at the same time as the rotation of the conveyor, the turret is rotated such that a further holder of the turret is placed above the dropping region. Again, an optoelectronic device can be dropped from this holder onto the dropping region and so on. Consequently, the conveyor, for example given by a rotating buffer blade, transports the optoelectronic device from one region to another in steps according to the turret indexing time. In other words, the rotations of the conveyor and of the turret can be synchronized with respect to each other. As the conveyor indexes according to the turret indexing time there is a consistent machine unit per hour output regardless of the distribution of the bins. The sorting of the optoelectronic devices is done in a parallel way such that the number of turret positions can be decreased. For example, the number of required turret positions can be decreased from 16 to 7 turret positions wherein the optoelectronic devices can be sorted into 64 different bins.

In the following the herein described assembly and the herein described method are explained in more detail using exemplary embodiments and respective illustrations. Advantageous embodiments and developments of the herein described assembly will become apparent from the exemplary embodiments described below in association with the figures.

BRIEF DESCRIPTION OF THE DRAWINGS

In the figures:

FIG. 2 shows a further exemplary embodiment of a herein described assembly.

DETAILED DESCRIPTION

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

Figure 1A:
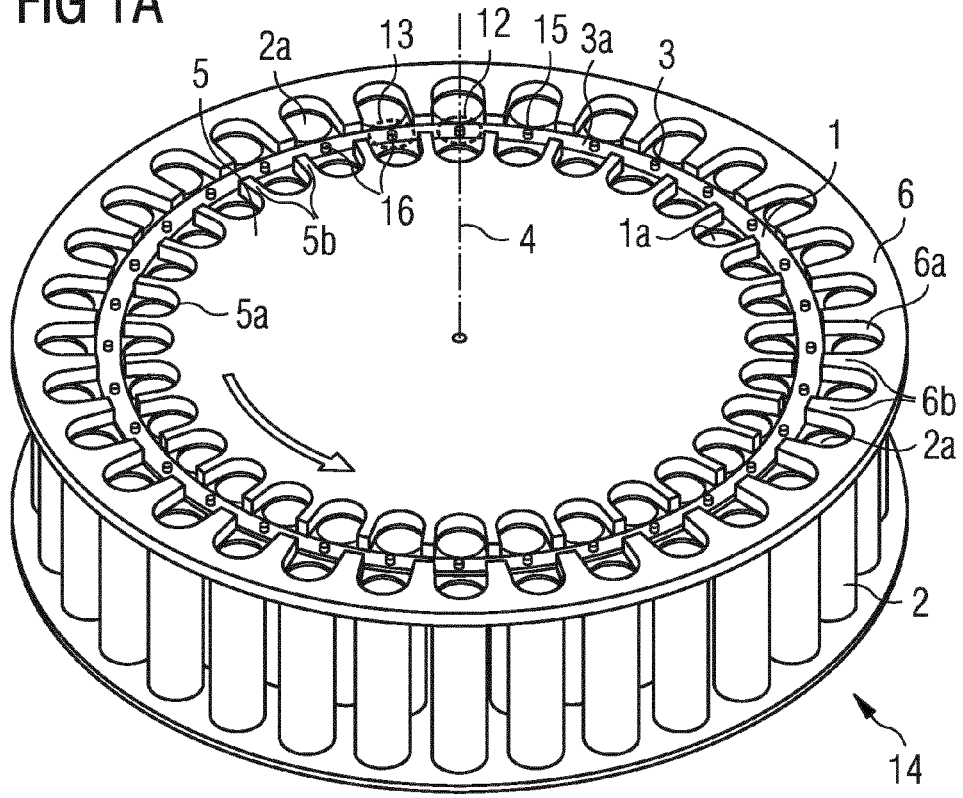
FIGS. 1A and 1B show different views of an exemplary embodiment of a herein described assembly.

FIG. 1 shows an exemplary embodiment of a herein described assembly. The assembly comprises a plurality of inner bins 1. Each inner bin has a cylindrical shape and is, for example, a plastic or metallic barrel. The inner bins are arranged in a circle. For example, the assembly comprises 32 inner bins.

Further, the assembly comprises outer bins 2. The outer bins 2 have the same shape as the inner bins 1. For example, the outer bins 2 are also given by metallic or plastic barrels of cylindrical shape. The outer bins are arranged alongside a second circle which has a greater diameter than the first circle. The first circle and the second circle are arranged coaxially with respect to axis 4 which runs through the centre point of the first and the second circle. A conveyor 3 is arranged between the inner bins and outer bins. In the present embodiment the conveyor 3 is a ring-shaped buffer plate. The conveyor 3 is arranged coaxially with respect to axis 4. Inner bins 1 and outer bins 2 are stationary; the conveyor 3 is rotatable with respect to the inner bins and the outer bins.

Thereby each pair of inner bins 1 and outer bins 2 which are arranged face-to-face with each other has a sorting region arranged between them. In the present embodiment the sorting region 13 is assigned to 64 bins which are divided into two rings of bins, the ring of inner bins and the ring of outer bins. The number of inner bins and outer bins is the same. There is only one common dropping region 12 which receives the units, for example optoelectronic devices, from a turret (see FIG. 2).

The conveyor 3 comprises a transport surface 3a on which optoelectronic devices 16 can be placed. For example an optoelectronic device 16 is placed in a dropping region 12 onto the transport surface 3a. From this position the optoelectronic device is transported by the conveyor, for example anticlockwise, to an adjacent sorting region 13. In this sorting region 13 a decision is made if the optoelectronic devices should be placed into the inner bin 1 or the outer bin 2 adjacent to the sorting region. If the optoelectronic device is not moved into either of these bins, the optoelectronic device is transported by the conveyor in the next moving step of the conveyor anticlockwise to the adjacent sorting region 13.

The assembly further comprises an inner plate 5 which has a plurality of recesses 5a. Each recess 5a is assigned to an inner bin 1 and fingers 5b, formed by the recesses 5a, surround the openings 1a of the inner bins at least partially. In particular the side of the openings 1a facing the conveyor 3 is not surrounded by the inner plate 5. The inner plate 5 projects beyond the opening 1a of each inner bin. If an optoelectronic device 16 is blown into the direction of the opening 1a of an inner bin, the inner plate 5 prevents the component from being blown over the opening and therefore prevents the optoelectronic device 16 from missing the opening.

In the same way as the inner plate the assembly comprises an outer plate 6 which has recesses 6a and fingers 6b. The outer plate 6 surrounds the openings 2a of the outer bins 2 and also prevents the loss of optoelectronic devices by forming a barrier for the optoelectronic devices.

The transport surface 3a is arranged at a high above the openings 1a and 2a. In this way gravity assists the transportation of the optoelectronic devices 16 into the assigned bins.

The described components, inner bins, outer bins, conveyor 3, inner plate 5, outer plate 6 and a base plate 8 on the side of the bins 1, 2 opposite to the openings 2a, 2b form a rotary binning system 14 of the assembly.

Figure 1B:
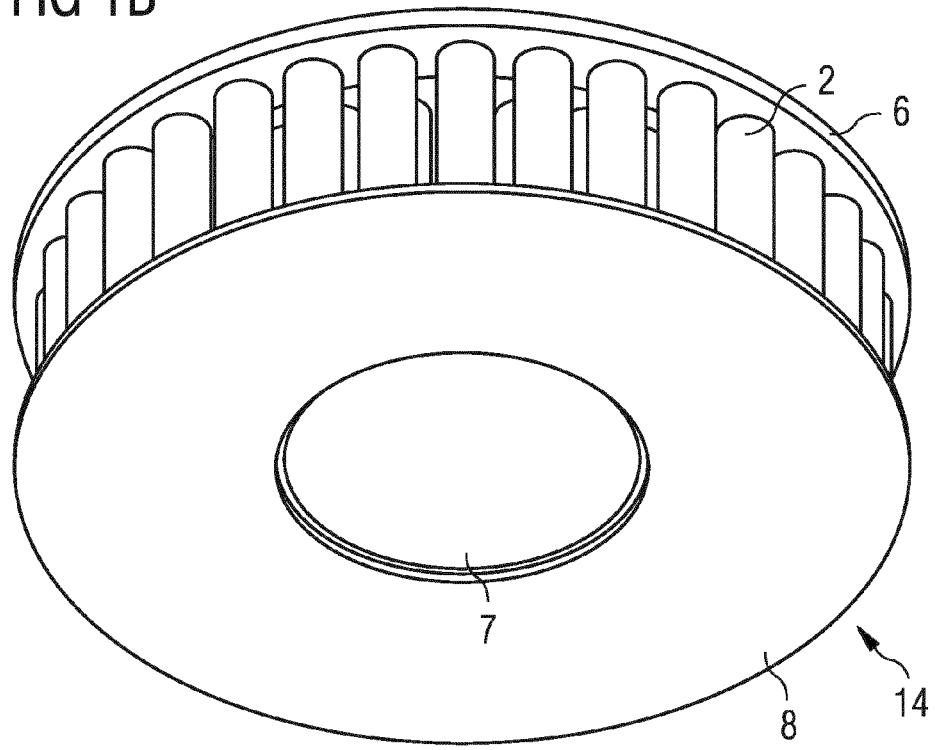

FIG. 1b shows a backside view of the rotary binning system with the ring-shaped base plate 8 surrounding a servomotor 7 which drives the rotation of the conveyor 3.

FIG. 2 shows the assembly comprising the rotary binning system 14 and a turret 10. The turret 10 comprises a plurality of holders 11 which are configured as pickup heads for holding optoelectronic devices 16. As can be seen from FIG. 2, optoelectronic devices 16 are dropped at the dropping region 12 onto the transport surface of the conveyor 3.

After dropping of the optoelectronic device 16 at the dropping region 12, the conveyor, for example the rotary buffer plate, rotates one step, e.g. anticlockwise, while the turret also indexes one region. The dropping region 12 is then empty and ready to receive another optoelectronic device from the turret. The optoelectronic devices remain on the conveyor 3 until they reach the correct sorting region, where they are, for example, blown into one of the assigned bins 1, 2. After that the conveyor starts to rotate again. In order to ensure that the dropping region 12 is always empty before accepting a new optoelectronic device, the blower will blow towards the inner bin assigned to the dropping region unless the optoelectronic device is tagged for the outer bin assigned to the dropping region 12.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. Assembly for sorting optoelectronic devices comprising:
   a plurality of inner bins arranged alongside a inner circle having a first diameter,
   a plurality of outer bins arranged alongside an outer circle having a second diameter greater than the first diameter,
   a conveyor, which is configured to transport a plurality of optoelectronic devices, wherein
   the inner circle, the outer circle and the conveyor are arranged concentric with respect to each other and share a common axis,
   the conveyor is arranged between the inner circle and the outer circle,
   the conveyor is pivot-mounted with respect to the axis, and
   the conveyor is rotatable with respect to the inner bins and the outer bins.

2. Assembly according to claim 1, wherein the conveyor has the shape of a ring.

3. Assembly according to claim 1, wherein the inner bins and the outer bins are arranged stationary.

4. Assembly according to claim 1, wherein
   each bin has a opening configured for receiving an optoelectronic devices,
   each opening is arranged at the same height as a transport surface or below the transport surface of the conveyor.

5. Assembly according to claim 1 further comprising means at each bin configured for guiding an optoelectronic device from the transport surface of the conveyor to the opening of the bin.

6. Assembly according to claim 1 further comprising:
   an inner guide plate having a plurality of recesses, wherein the inner guide plate projects above the openings of the inner bins, and
   in the region of each recess the inner guide plate partially surrounds the opening of an inner bin assigned to the recess.

7. Assembly according to claim 6 further comprising:
   an outer guide plate having a plurality of recesses, wherein the outer guide plate projects above the openings of the outer bins, and
   in the region of each recess the outer guide plate partially surrounds the opening of an outer bin assigned to the recess.

8. Assembly according to claim 7, wherein at least one of the outer bins and/or at least one of the inner bins has a cylindrical shape.

9. Assembly according to claim 7 comprising an equal number of outer bins and inner bins.

10. Assembly according claim 1 further comprising:
    a turret with a plurality of holders, each holder is configured to carry one optoelectronic device.

11. Method for sorting a plurality of optoelectronic devices with the assembly according claim 7, wherein
    a holder of the turret is placed above a dropping region of the transport surface,
    an optoelectronic device is dropped from the holder onto the dropping region,
    the conveyor is rotated with respect to the inner bins and the outer bins, transporting the optoelectronic device from the dropping region to a sorting region, and
    the turret is rotated such that a further holder of the turret is placed above the dropping region.

12. Method according claim 11, wherein rotations of the conveyor and of the turret are synchronized with respect to each other.

* * * * *